United States Patent
Bhatia et al.

(10) Patent No.: US 11,129,303 B1
(45) Date of Patent: Sep. 21, 2021

(54) COOLING OF SERVER HIGH-POWER DEVICES USING DOUBLE-BASE PRIMARY AND SECONDARY HEAT SINKS

(71) Applicant: Cisco Technology, Inc., San Jose, CA (US)

(72) Inventors: Rakesh Bhatia, San Jose, CA (US); Mark Hong Chen, Palo Alto, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/802,641

(22) Filed: Feb. 27, 2020

(51) Int. Cl.
*H05K 7/20* (2006.01)
*H05K 1/02* (2006.01)

(52) U.S. Cl.
CPC ....... *H05K 7/20736* (2013.01); *H05K 1/0203* (2013.01); *H05K 7/20154* (2013.01); *H05K 7/20727* (2013.01); *H05K 7/20336* (2013.01); *H05K 7/20809* (2013.01)

(58) Field of Classification Search
CPC .......... H05K 7/20336; H05K 7/20809; H05K 1/0203; H05K 2201/064; H01L 23/427
USPC ................... 361/700; 165/80.4–80.5, 104.33
See application file for complete search history.

(56) References Cited

U.S. PATENT DOCUMENTS

| | | | |
|---|---|---|---|
| 6,712,129 B1* | 3/2004 | Lee ..................... | F28D 15/0275 165/104.21 |
| 7,269,012 B2* | 9/2007 | Lee .......................... | G06F 1/20 165/80.3 |
| 7,436,667 B2* | 10/2008 | Wu .......................... | G06F 1/20 165/104.33 |
| 8,199,503 B2* | 6/2012 | Tomioka .............. | H05K 7/2049 361/700 |

OTHER PUBLICATIONS

Raghupathy, Arun et al., "Tablet Teardown—Challenges in the Thermal Management of Forced Convection Tablets", vol. 4, Issue 2, https://www.mentor.com/products/mechanical/engineering-edge/volume4/issue2/tablet-teardown-thermal-management-forced-convention, downloaded Feb. 26, 2020, 3 pages.

Artman, Paul, "The Benefits of Lenovo Thermal Transfer Module Technology in ThinkSystem SD530 Servers", Form No. LP0922, https://lenovopress.com/lp0922-thermal-transfer-module-technology, Aug. 22, 2018, 5 pages.

(Continued)

*Primary Examiner* — Zachary Pape
(74) *Attorney, Agent, or Firm* — Edell, Shapiro & Finnan, LLC (57) ABSTRACT

A cooling system includes a primary heat sink including a primary top base plate, a primary bottom base plate and a primary fin pack including a plurality of fins, where the primary fin pack is disposed between the primary top base plate and the primary bottom base plate. The cooling system further includes secondary heat sink including a secondary top base plate, a secondary bottom base plate and a secondary fin pack including a plurality of fins, where the secondary fin pack is disposed between the secondary top base plate and the secondary bottom base plate. A heat pipe extends between the primary top base plate and the primary bottom base plate, where the heat pipe further extends from the primary heat sink and couples with the secondary heat sink.

16 Claims, 5 Drawing Sheets

(56) References Cited

OTHER PUBLICATIONS

Vaid, Hushagra et al., "Microsoft reimagines open source cloud hardware", Oct. 31, 2016, https://azure.microsoft.com/ko-kr/blog/microsoft-reimagines-open-source-cloud-hardware/, 4 pages.

Thermo Cool Corporation, "Snapped Fin Heat Sinks", Zipper & Stacked Fin Configurations, https://thermocoolcorp.com/project/snapped-fins/, downloaded Feb. 26, 2020, 4 pages.

* cited by examiner

COOLING OF SERVER HIGH-POWER DEVICES USING DOUBLE-BASE PRIMARY AND SECONDARY HEAT SINKS

TECHNICAL FIELD

The present disclosure relates to heat sink structures for providing cooling to electronic devices.

BACKGROUND

Typical high-power devices used on servers or other computing devices, such as a CPU (central processing unit), a GPU (graphics processing unit) or another integrated circuit component, require a significant amount of power (e.g., in a range of about 300 Watts), and the trend for power consumption of such components has been ever increasing. This in turn results in an ever increasing heat dissipation by these components. In order to properly cool the high-power components and maintain temperatures under rated thermal specifications, heat sinks for air cooling are deployed on the printed circuit board (PCB) of a device. It is ideal to provide heat sink structures that effectively cool and dissipate heat such high-power devices and further are arranged to minimize the footprint on the PCB.

DESCRIPTION OF EXAMPLE EMBODIMENTS

Overview

In an embodiment, a cooling system comprises a primary heat sink comprising a primary top base plate, a primary bottom base plate and a primary fin pack comprising a plurality of fins, where the primary fin pack is disposed between the primary top base plate and the primary bottom base plate. The cooling system also comprises a secondary heat sink comprising a secondary top base plate, a secondary bottom base plate and a secondary fin pack comprising a plurality of fins, wherein the secondary fin pack is disposed between the secondary top base plate and the secondary bottom base plate. In addition, the cooling system comprises a heat pipe that extends between the primary top base plate and the primary bottom base plate, wherein the heat pipe further extends from the primary heat sink and couples with the secondary heat sink.

In another embodiment, a cooling system comprises a primary heat sink comprising a primary top base plate, a primary bottom base plate and a primary fin pack comprising a plurality of fins, where the primary fin pack is disposed between the primary top base plate and the primary bottom base plate. The cooling system further comprises a first secondary heat sink and a second secondary heat sink. The first secondary heat sink comprises a first secondary top base plate, a first secondary bottom base plate and a first secondary fin pack comprising a plurality of fins, where the first secondary fin pack is disposed between the first secondary top base plate and the first secondary bottom base plate. The second secondary heat sink comprises a second secondary top base plate, a second secondary bottom base plate and a second secondary fin pack comprising a plurality of fins, where the second secondary fin pack is disposed between the second secondary top base plate and the second secondary bottom base plate. The cooling system further comprises a plurality of heat pipes, where the plurality of heat pipes comprises a first heat pipe and a second heat pipe. The first heat pipe extends between the primary top base plate and the primary bottom base plate and further extends from the primary heat sink to couple with the first secondary heat sink. The second heat pipe extends between the primary top base plate and the primary bottom base plate and further extends from the primary heat sink to couple with the second secondary heat sink. [mu] In a further embodiment, an apparatus comprises a printed circuit board (PCB), a heat generating component integrated with the PCB, and a cooling system. The cooling system comprises a primary heat sink disposed along the PCB and comprising a primary top base plate, a primary bottom base plate and a primary fin pack comprising a plurality of fins, where the primary fin pack is disposed between the primary top base plate and the primary bottom base plate, wherein the primary heat sink is disposed over the heat generating component, a secondary heat sink disposed along the PCB comprising a secondary top base plate, a secondary bottom base plate and a secondary fin pack comprising a plurality of fins, where the secondary fin pack is disposed between the secondary top base plate and the secondary bottom base plate, and a heat pipe that extends between the primary top base plate and the primary bottom base plate, wherein the heat pipe further extends from the primary heat sink and couples with the secondary heat sink.

Example Embodiments

As described herein, a cooling system for cooling a component of an electronic device comprises a primary heat sink and at least one secondary heat sink thermally coupled with the primary heat sink via at least one heat pipe. Each of the primary and secondary heat sinks includes a double base, or a top base and a bottom base, with a plurality of cooling fins disposed between the top and bottom bases. Heat pipes also extend between the top and bottom bases for each heat sink to facilitate transfer of heat between top and bottom locations of each heat sink. The configuration of the cooling system as described herein, in which a double-base primary heat sink is thermally coupled with one or more double-base secondary heat sinks, improves cooling fin efficiency and facilitates improved energy efficiency by allowing cooling fans associated with the cooling system to operate at slower fan speeds during cooling operations.

The cooling system is useful for electronic devices, such as network devices including server systems that include semiconductor chips (e.g., CPUs (Central Processing Units), GPUs (Graphics Processing Units), or semiconductor devices), which typically require heat sinks to dissipate thermal energy generated by the chips. Operational power for such devices can be about 300 Watts, and the trend has been for power to be ever increasing with newer technological designs. Example embodiments of electronic devices with which the cooling system can be implemented include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise one or more fans and heat sinks as described herein to provide cooling to electronic components (e.g., processors, such as CPUs or GPUs, or other semiconductor devices) of the network device (e.g., server, router, switch, or other network device). The network device may further include any combination of memory, processors, power supply units, and network interfaces.

As network systems speeds and power requirements increase, the emission from electronic components increases along with a need for improved cooling. In order to properly cool the high power components and maintain their temperatures under rated thermal specifications, heat sinks are implemented for use with air cooling from fans. As the height of a heat sink increases, the fin thickness (i.e., thicker material forming the elongated fins) typically also increases to improve fin efficiency. However, increasing fin thickness results in fewer fins to prevent air pressure losses arising from lower air gaps from becoming too large for system fans to drive air through the fins. To ensure improved fin efficiency and minimize fin thickness, an alternative design is desired. The cooling system as described herein provides a configuration that achieves improved fin efficiency with minimized fin thickness.

Figure 1:
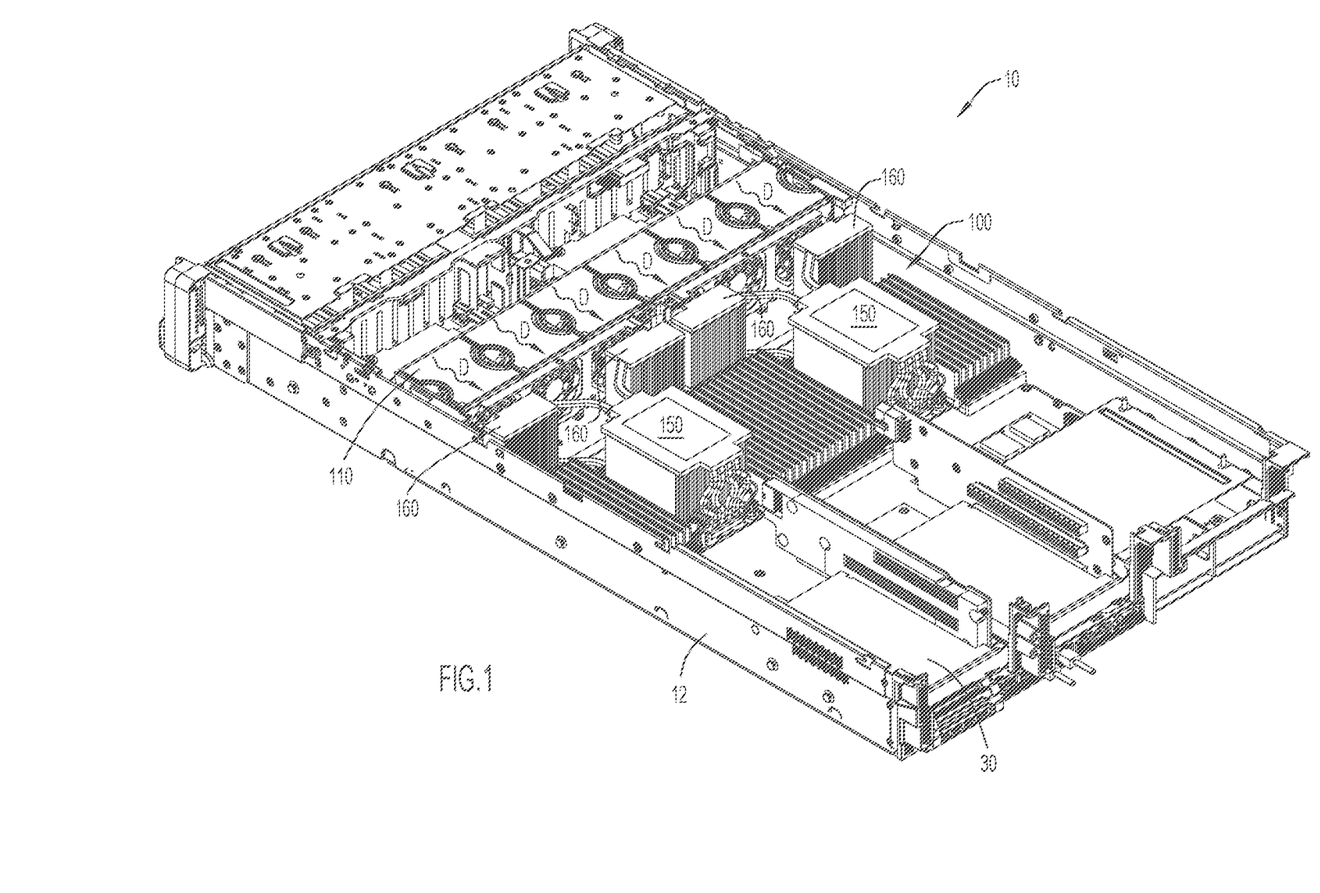
FIG. 1 is a view in perspective of an example embodiment of an electronic device including a cooling system.
Figure 2:
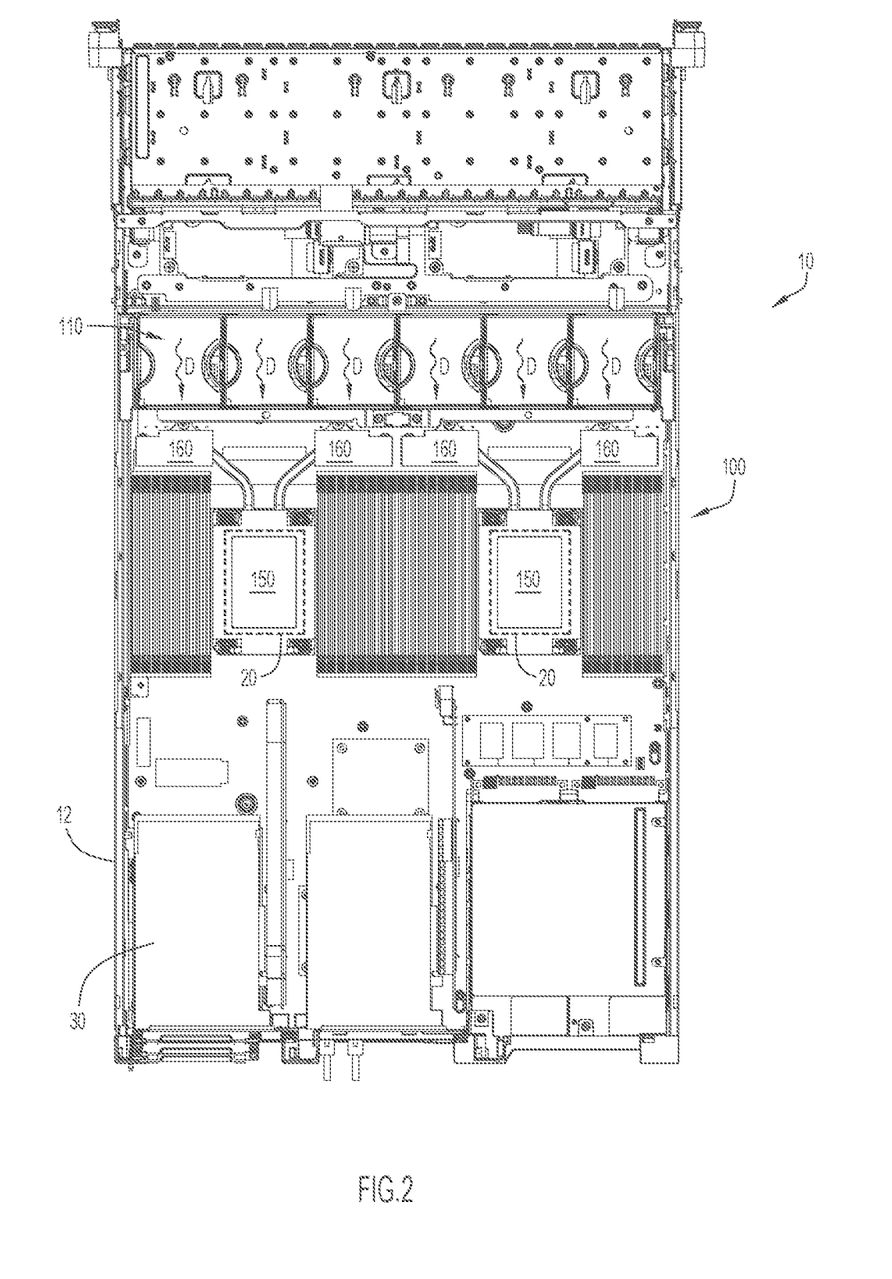
FIG. 2 is a top view in plan of the electronic device with cooling system of FIG. 1.

Referring to FIGS. 1-4, an example embodiment is depicted of a cooling system including double-base primary and secondary heat sinks implemented with an electronic device to provide cooling to one or more components of the electronic device during operations of the device. As shown in FIGS. 1 and 2, an electronic device 10, e.g., a network or other electronic device such as a rack server, includes a generally rectangular chassis or housing 12. Disposed within the housing 12 are various components, including a printed circuit board (PCB) with various integrated circuit and/or other components integrated within layers of the PCB and/or disposed at a top surface of the PCB. The components integrated with the PCB can include, e.g., transistors, capacitors, resistors, inductors, etc. Conductive traces can be embedded within the layers and/or deposited on the PCB, where the conductive traces connect components with each other. In particular, the PCB includes one or more processors 20, such as CPUs and/or GPUs, which control operations of the device 10. Disposed at one end near a front side of the housing 12 is one or more hard drives 30.

Centrally located within the housing 12 of the device 10 is a cooling system 100 that comprises a plurality or array of cooling fans 110 and heat sinks disposed at a location forward and downstream (i.e., in a direction of cooling air flow from the fans, shown as arrows labeled D in FIGS. 1 and 2) from the cooling fans 110. One or more sets of heat sinks can be disposed directly over and/or adjacent to one or more heat generating components of the PCB (e.g., directly over processors 20, shown generally as phantom lines in FIG. 2). In particular, each set of heat sinks includes a primary heat sink 150 and a pair of secondary heat sinks 160 each of which is separately and independently connected or thermally coupled with the primary heat sink 150 (e.g., via one or more heat pipes) as described herein. The heat sinks transfer heat generated by the electronic components to which the heat sinks are proximate or adjacent so as to effectively cool the components during operations of the device 10 in order to ensure effective performance of the device 10. The heat sinks and cooling fans can be secured with the PCB in any suitable manner via any suitable types of fasteners (e.g., threaded fasteners).

As shown in FIGS. 1 and 2, the device 10 includes two sets of heat sinks, where the primary heat sink 150 of each set is disposed directly above a component (e.g., a processor 20), and with secondary heat sinks 160 associated with each primary heat sink 150 being disposed behind the primary heat sink 150 to which it is thermally coupled. Each secondary heat sink 160 is further disposed between the primary heat sink 150 to which it is thermally coupled and the array of cooling fans 110, with the array of cooling fans 110 being disposed directly behind the secondary heat sinks 160 along the PCB. It is noted that an electronic device can include any suitable number of sets of heat sinks (e.g., one or more sets) as well as any suitable number of cooling fans, depending upon a specific architecture of a PCB and the number and/or types of components that require cooling during operations of the device.

Each of the heat sinks includes two bases (i.e., each heat sink comprises a double-base heat sink) in the form of an upper or top base plate and a lower or bottom base plate, with the top and bottom base plates being generally parallel with each other. The bottom base plates of the heat sinks can include, e.g., threaded fasteners or any other suitable engagement structure to secure the heat sinks to the PCB of the device 10. It is noted that the terms upper, top, lower, bottom, front, forward, rear and the like in relation to the bases and other components as described herein are relative terms dependent upon the orientation of the heat sinks and device to which the heat sinks are secured and should not be interpreted in a limiting manner.

Figure 3A:
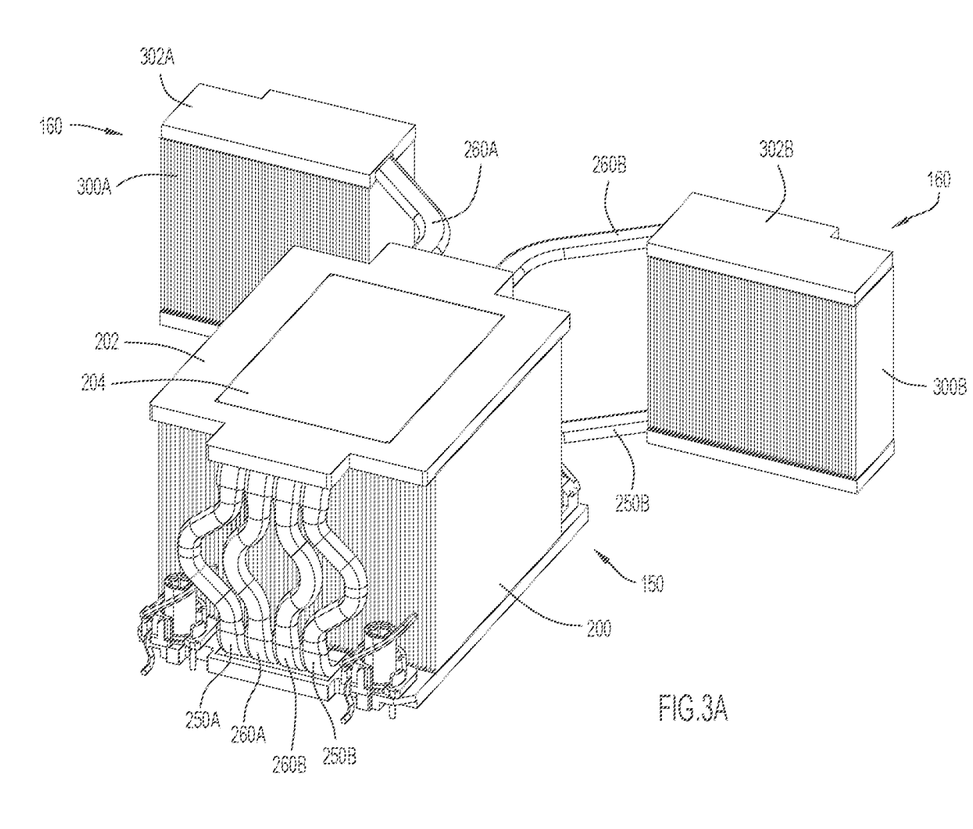
FIG. 3A is a front view in perspective of the primary and secondary double-base heat sinks of the cooling system of FIG. 1.
Figure 3B:
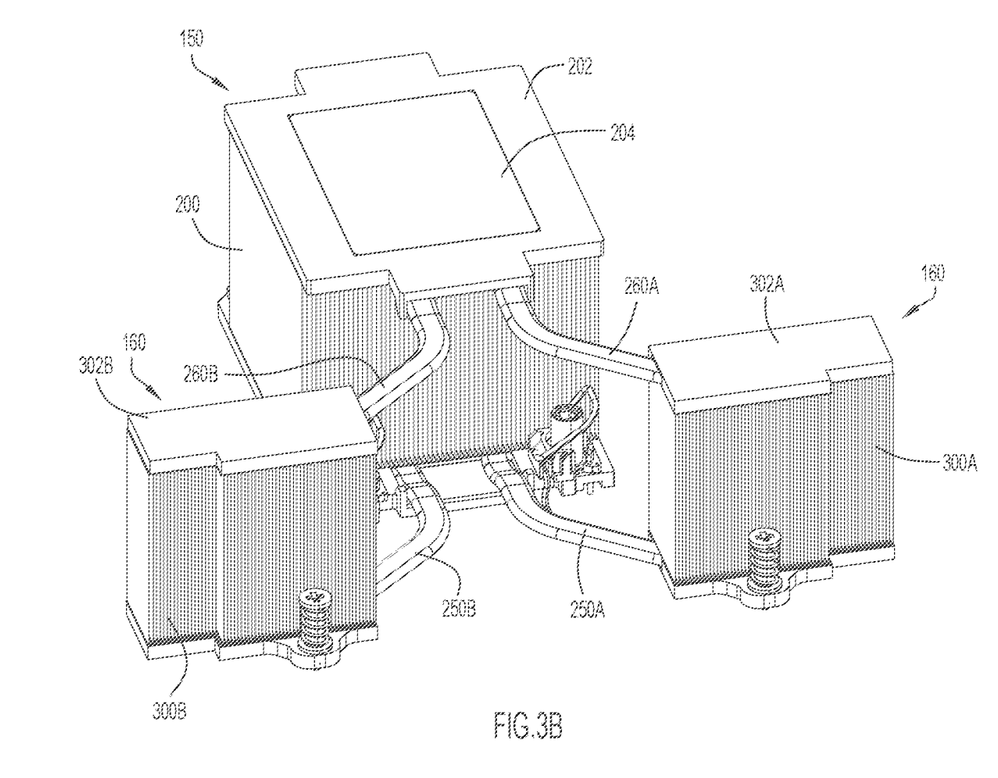
FIG. 3B is a rear view in perspective of the primary and secondary double-base heat sinks of the cooling system of FIG. 1.
Figure 4:
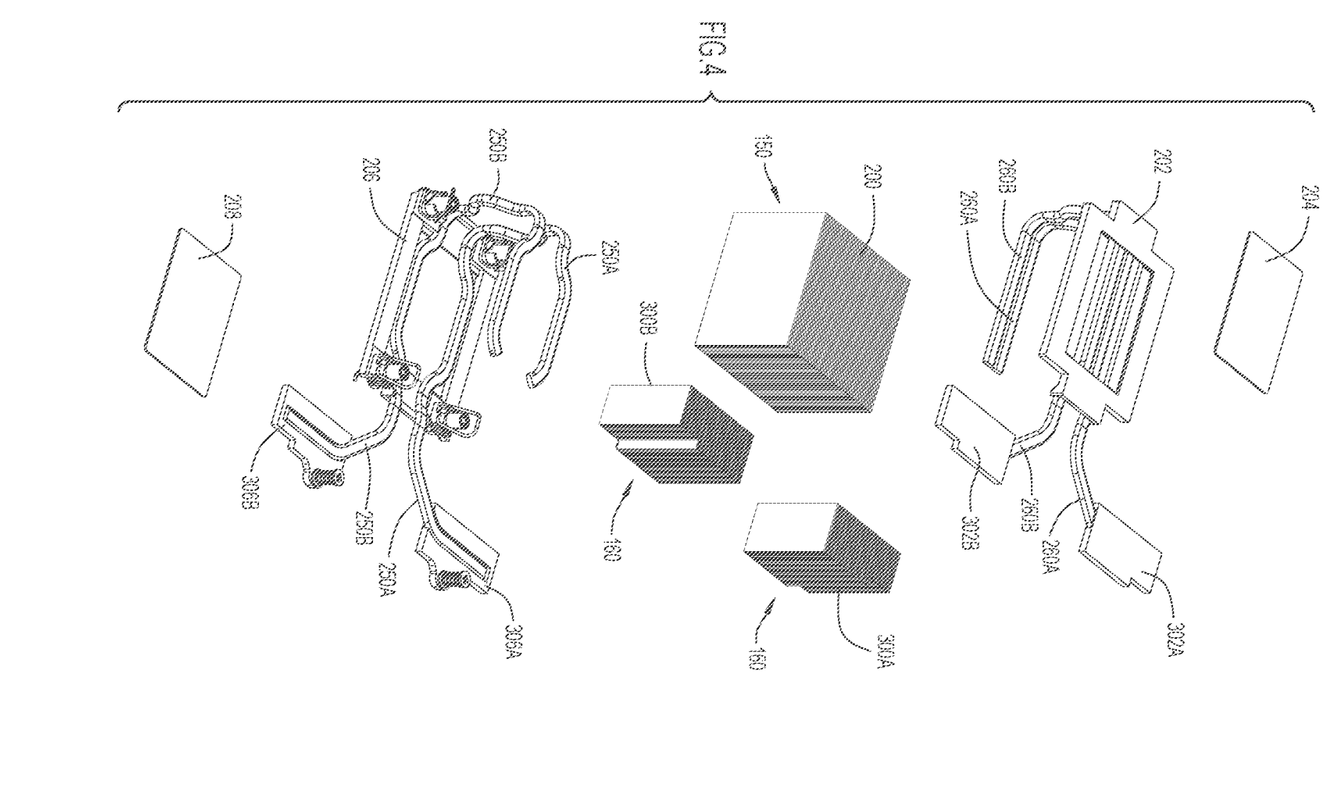
FIG. 4 is an exploded view in perspective of the primary and secondary double-base heat sinks of the cooling system of FIG. 1.

Referring to FIGS. 3A, 3B and 4, the primary heat sink 150 includes a generally rectangular top base plate 202, a generally rectangular bottom base plate 206 spaced from the top base plate 202, and a set of fins or a fin pack 200 disposed between the top base plate 202 and the bottom base plate 206. Similarly, each secondary heat sink 160 includes a top base plate, a bottom base plate spaced from the top base plate, and a set of fins or fin pack disposed between the top and bottom base plates. In particular, one secondary heat sink 160 includes a generally rectangular top base plate 302A, a generally rectangular bottom base plate 306A, and a fin pack 300A disposed between the top base plate 302A and bottom base plate 306A, while another secondary heat sink 160 includes a generally rectangular top base plate 302B, a generally rectangular bottom base plate 306B, and a fin pack 300B disposed between the top base plate 302B and bottom base plate 306B.

The top and bottom base plates for each of the primary and secondary heat sinks can be formed of a metal or other material having a suitable thermal conductivity. In an example embodiment, each of the top and bottom base plates for the primary and secondary heat sinks are formed of aluminum. Each secondary heat sink 160 that is thermally coupled with a primary heat sink 150 has one or more overall dimensions (length, height and/or width dimensions) that are smaller in relation to the overall dimensions (length, height, width dimensions) of the primary heat sink. In an example embodiment, the length dimensions for the fin packs and the fins of the secondary heat sinks are less than the length dimensions for the fin pack and the fins of the primary heat sink thermally coupled with the secondary heat sinks (where each length dimension is defined as the direction of air flow through the heat sinks). In addition, the fin pack width dimension for each secondary heat sink is also smaller in relation to the fin pack width dimension for the primary sink thermally coupled with the secondary heat sinks.

Each of the top and bottom base plates of the primary heat sink 150 further includes a block plate that is integrated with the base plate (e.g., provided as a separate plate that fits within a cut-out section, opening or window of each base plate). For example, the top base plate 202 of the primary heat sink 150 includes a generally rectangular top block plate 204 that fits within an opening or cut-out section of and connects with the top base plate 202, while the bottom base plate 206 includes a generally rectangular bottom block plate 208 that fits within an opening or cut-out section of and connects with the bottom base plate 206. Each block plate is also formed of a metal or other material having a suitable thermal conductivity, where the thermal conductivity of the block plate can differ from the thermal conductivity of the base plate to which it is connected. For example, each block plate can have a greater thermal conductivity compared to the thermal conductivity of the base plate to which the block plate is connected. In an example embodiment, each block plate of the primary heat sink is formed of copper, while each base plate of the primary heat sink is formed of aluminum. As can be seen, e.g., in FIG. 2, the cooling system 100 is arranged on the PCB of the electronic device 10 such that the bottom block plate 208 of a primary heat sink 150 lies directly over (and in closest proximity to) the component (e.g., processor 20) to be cooled.

The fin pack 200 for the primary heat sink 150 includes a plurality of fins, and the fin pack 300A, 300B for each secondary heat sink 160 includes a plurality of fins, where the fins comprise thin conductive plates that are arranged in parallel with each other and with their lengths oriented in-line or generally parallel with a direction of airflow provided by the cooling fans located behind the heat sinks. The fins for each fin pack are constructed of a metal (e.g., aluminum) or other material having a suitable thermal conductivity to provide effective heat transfer performance. Each fin for the fin packs of the primary and secondary heat sinks is very thin, having a thickness that is less than about 0.50 millimeter (mm), preferably no greater than about 0.30 mm. In an example embodiment, each fin for the fin pack 200 of the primary heat sink has a thickness of about 0.25 mm, while each fin for the fin pack 300A and the fin pack 300B of the secondary heat sinks has a thickness of about 0.20 mm.

The primary heat sink 150 includes a plurality of heat pipes, each heat pipe having a curved or looped configuration that allows the heat pipe to extend between the top base plate 202 and the bottom base plate 206, where the heat pipes also extend to the secondary heat sinks 160 in the manner as described herein. The heat pipes are constructed of a metal (e.g., copper) or any other material having a suitable thermal conductivity to enable heat transfer along the heat pipes in the manner described herein. The heat pipes are hollow and can include any suitable coolant or working fluid sealed within the heat pipes to facilitate effective heat transfer between different portions of the heat sinks via the heat pipes. In addition, the heat pipes can have any suitable transverse cross-sectional shapes (e.g., circular, oval/elliptical, rectangular, etc.) as well as any suitable cross-sectional dimensions. In an example embodiment, each heat pipe has a cross-sectional dimension (e.g., diameter) in the range of less than about 10 mm (e.g., about 6 mm).

Referring to FIGS. 3A, 3B and 4, a first heat pipe 250A and a second heat pipe 250B have a general U-shape and originate at a location at a top side of the fin pack 200, where the first and second heat pipes are spaced apart and extend generally parallel to each other from a location near a rear side and along the top side of the fin pack 200 and below the top base plate 202 (i.e., top portions of the first and second heat pipes are disposed between the fin pack top side and the top base plate). The top base plate 202 can include channels or grooves along its bottom surface that are suitably dimensioned to receive and retain the first and second heat pipes so that the first and second heat pipes can sufficiently contact the top base plate and the top edges of fins within the fin pack 200 while the top block plate 204 also contacts the top edges of the fins within the fin pack 200. The first heat pipe 250A and the second heat pipe 250B further extend in a continuous manner forward and along the top side, where each heat pipe then bends so as to extend along the front side of the fin pack 200. Along the front side of the fin pack 200 (as shown in FIG. 3A), the first heat pipe 250A and the second heat pipe 250B bow slightly outward and away from each other as they extend from the top base plate 202 to the bottom base plate 206. The first and second heat pipes bend around the front side to a bottom side of the fin pack 200 and continue to extend along the fin pack bottom side and above the bottom base plate 206 (i.e., bottom portions of the first and second heat pipes are disposed between the fin pack bottom side and the bottom base plate). Similar to the top base plate 202, the bottom base plate 206 can include channels or grooves along its top surface that are suitably dimensioned to receive and retain the first and second heat pipes so that the first and second heat pipes can sufficiently contact the bottom base plate and the bottom edges of fins within the fin pack 200 while the bottom base plate also maintains contact with the bottom edges of the fins within the fin pack 200.

The first and second heat pipes further extend along the bottom side and from the front side to the rear side of the fin pack 200. The first heat pipe 250A continues extending beyond the rear side and away from the fin pack 200 (as shown in FIG. 3B) to connect with the fin pack 300A of a secondary heat sink 160, while the second heat pipe 250B continues extending beyond the rear side and away from the fin pack 200 to connect with the fin pack 300B of a secondary heat sink 160. The first and second heat pipes bend outward and away from each other as they approach and connect with a corresponding secondary heat sink 160 (thus thermally coupling the primary and secondary heat sinks), where the first heat pipe 250A extends along a bottom side of fin pack 300A and above bottom base plate 306A (i.e., the first heat pipe 250A is between the fin pack bottom side and the bottom base plate 306A) and the second heat pipe 250B extends along a bottom side of fin pack 300B and above bottom base plate 306B (i.e., the second heat pipe 250B is between the fin pack bottom side and the bottom base plate 306B). The bottom base plates 306A, 306B for each fin pack 300A, 300B can also include channels or grooves along their top surfaces that are suitably dimensioned to receive and retain the first and second heat pipes so that the first and second heat pipes can sufficiently contact the bottom base plates and bottom edges of the fin packs 300A, 300B while the bottom base plates of the secondary heat sinks also maintain contact with the bottom edges of their corresponding fin packs.

A third heat pipe 260A and a fourth heat pipe 260B have similar shapes but extend in an opposite manner in relation to the first and second heat pipes. In particular, each of the third heat pipe 260A and the fourth heat pipe 260B has a general U-shape and originates at a location at the bottom side of the fin pack 200, where the third and fourth heat pipes are aligned close together and extend generally parallel to each other from a location near a rear side and along the bottom side of the fin pack 200 and above the bottom base plate 206 (i.e., bottom portions of the third and fourth heat pipes are disposed between the fin pack bottom side and the bottom base plate). The third and fourth heat pipes are further located along the space between the first and second heat pipes at the bottom side of the fin pack 200, where the third and fourth heat pipes also extend along the bottom block plate 208. As with the first and second heat pipes, the bottom base plate 206 (and also the bottom block plate 208) can include channels or grooves along its top surface that are suitably dimensioned to receive and retain the third and fourth heat pipes so that the third and fourth heat pipes can sufficiently contact the bottom base plate (and bottom block plate) and the bottom edges of fins within the fin pack 200 while the bottom base plate (and bottom block plate) maintains contact with the bottom edges of the fins within the fin pack 200. The third heat pipe 260A and the fourth heat pipe 260B further extend in a continuous manner forward and along the bottom side of the fin pack 200, where each heat pipe then bends so as to extend along the front side of the fin pack 200. Along the front side of the fin pack 200 (as shown in FIG. 3A), the third heat pipe 260A and the fourth heat pipe 260B bow slightly outward and away from each other as they extend from the bottom base plate 206 to the top base plate 202. The third and fourth heat pipes are further located between the first and second heat pipes along the front side of the fin pack 200. The third and fourth heat pipes 260A, 260B bend around the front side to the top side of the fin pack 200 and continue to extend along the fin pack top side and above the bottom base plate 206 (i.e., top portions of the third and fourth heat pipes are disposed between the fin pack top side and the top base plate). The third and fourth heat pipes are also located between the first and second heat pipes at the top side of the fin pack 200, where the third and fourth heat pipes further extend beneath the top block plate 204. The top base plate 202 (and top block plate 204) can include channels or grooves along its bottom surface that are suitably dimensioned to receive and retain the third and fourth heat pipes so that the third and fourth heat pipes can sufficiently contact the top base plate (and top block plate) and the top edges of fins within the fin pack 200 while the top base plate (and top block plate) maintains contact with the top edges of the fins within the fin pack 200.

The third and fourth heat pipes further extend along the top side and from the front side to the rear side of the fin pack 200. The third heat pipe 260A continues extending beyond the rear side and away from the fin pack 200 to the fin pack 300A (as shown in FIG. 3B) of the corresponding secondary heat sink 160, while the fourth heat pipe 260B continues extending beyond the rear side and away from the fin pack 200 to the fin pack 300B of the corresponding secondary heat sink 160. The third and fourth heat pipes bend outward and away from each other as they approach and connect with their corresponding secondary heat sink 160 (so as to thermally couple the primary heat sink with each secondary heat sink), where the third heat pipe 260A extends along a top side of fin pack 300A and beneath top base plate 302A (i.e., the third heat pipe 260A is between the fin pack top side and the top base plate 302A) and the fourth heat pipe 260B extends along the top side of fin pack 300B and beneath top base plate 302B (i.e., the fourth heat pipe 260B is between the fin pack top side and the top base plate 302B). The top base plates 302A, 302B for each fin pack 300A, 300B can also include channels or grooves along their bottom surfaces that are suitably dimensioned to receive and retain the third and fourth heat pipes so that the third and fourth heat pipes can sufficiently contact the top base plates and top edges of the fin packs 300A, 300B while each of the top base plate 302A and the top base plate 302B also maintains contact with the top edges of its corresponding fin pack 300A or fin pack 300B.

Each of the first heat pipe 250A, second heat pipe 250B, third heat pipe 260A and fourth heat pipe 260B extends in a direction along the top and bottom sides of the primary heat sink 150 that is in-line or generally parallel with the lengthwise direction of the fins (i.e., in-line or generally parallel to the direction of air flow) for fin pack 200 of the primary heat sink 150. The same heat pipes also extend in a direction along the top side or the bottom side of the corresponding secondary heat sink 160 that is transverse (e.g., perpendicular) with the lengthwise direction of the fins (i.e., transverse or perpendicular to the direction of air flow) for fin packs 300A, 300B. The directions of the heat pipes as well as the location of the heat pipes within the channels of the base plates (and top block plates) helps to minimize the width dimensions of the heat sinks as well as to minimize or prevent removal of cut-out portions of slices of the fins for the fin packs when the heat pipes traverse the top and bottom sides of the fin packs. The heat pipes are also oriented so that the primary heat sink includes the same number of heat pipes extending along its top and bottom base plates (e.g., the primary heat sink 150 in the example embodiment includes four heat pipes extending along its top and bottom base plates, and each secondary heat sink 160 in the example embodiment includes two heat pipes extending along its top and bottom base plates).

During operations of the device 10, the cooling fans 110 are operated provide a flow of air at a selected flow rate along the direction shown by arrows labeled as D (as shown in FIGS. 1 and 2) toward secondary heat sinks 160 and primary heat sink 150 for each set of heat sinks in the cooling system 100, where the airflow passes through the lengthwise dimension of the fin packs 300A, 300B, 200. The cooling fans 110 can be operated based upon an indication (e.g., one or more measured temperatures obtained by one or more temperature sensors provided at selected locations along the PCB) that cooling is required for one or more components of the device, such as processors 20.

The heat pipes operate to transport and dissipate thermal energy from the top and bottom base plates of the primary heat sink 150 and the secondary heat sinks 160 toward a central location of the fin packs. The top and bottom base plates also conduct heat from the top and bottom sides of the heat sinks toward a central location of the fins in the fin packs. The airflow provided by the cooling fans 110 is directed first through the fins of fin packs 300A, 300B and then through fin pack 200 (since primary heat sink 150 is located forward the secondary heat sinks 160 and the cooling fans 110 and thus downstream in the direction of airflow from the cooling fans) to effectively draw heat away from the heat sinks and the PCB components being cooled. The combined use of a primary heat sink with one or more (e.g., two) secondary heat sinks, where each heat sink includes a double base (i.e., an upper/top and lower/bottom base plate), also provides a more efficient dissipation of thermal energy from high power devices on the PCB (e.g., components such as CPUs and GPUs). This in turn allows the cooling fans that provide a flow of air through the fin packs of the heat sinks to operate at lower speeds thus reducing the amount of power required to operate the cooling system and enhancing the overall energy efficiency of the device in which the cooling system is implemented. The configuration of double base primary and secondary heat sinks also allows for reducing the thickness of the cooling fins, which further enhances the thermal performance of the cooling system.

The cooling system including primary and secondary double base heat sinks is not limited to the example embodiment described herein but can include any suitable modifications for a particular configuration with an electronic device. For example, the cooling system can include any suitable number of cooling fans to provide cooling air to the heat sinks. The primary heat sink can include one or more secondary heat sinks thermally coupled with the primary heat sink (via one or more heat pipes). Any selected number of heat pipes (one or more) can be provided for each heat sink, where each heat pipe can bend so as to traverse or extend between the top base plate and the bottom base plate and further extend between a primary heat sink and a secondary heat sink. Each heat sink can have any suitable length, width and height dimensions configured to provide adequate cooling for a particular application (e.g., cooling of one or more components for an electronic device), and each fin pack can include any suitable number of cooling fins having any suitable length, width and thickness dimensions for a particular application.

Thus, in an example embodiment, a cooling system comprises a primary heat sink comprising a primary top base plate, a primary bottom base plate and a primary fin pack comprising a plurality of fins, wherein the primary fin pack is disposed between the primary top base plate and the primary bottom base plate. The cooling system also comprises a secondary heat sink comprising a secondary top base plate, a secondary bottom base plate and a secondary fin pack comprising a plurality of fins, wherein the secondary fin pack is disposed between the secondary top base plate and the secondary bottom base plate. In addition, the cooling system comprises a heat pipe that extends between the primary top base plate and the primary bottom base plate, where the heat pipe further extends from the primary heat sink and couples with the secondary heat sink.

The cooling system can further comprise a plurality of secondary heat sinks coupled with the primary heat sink. A top portion of the heat pipe can extend between the primary top base plate and a top side of the primary fin pack, and a bottom portion of the heat pipe can extend between the primary bottom base plate and a bottom side of the primary fin pack.

The cooling system can further comprise a plurality of heat pipes extending between the primary top base plate and the primary bottom base plate, where the plurality of heat pipes comprise a first heat pipe extending from the primary top base plate to the primary bottom base plate and further from the primary bottom base plate to the secondary bottom base plate, and a second heat pipe extending from the primary bottom base plate to the primary top base plate and further from the primary top base plate to the secondary top base plate.

A length dimension of the fins for the secondary fin pack of the cooling system can be less than a length dimension of the fins for the primary fin pack, where each length dimension is defined in a direction of airflow through the primary fin pack and the secondary fin pack.

Each of the primary top base plate and the primary bottom base plate of the cooling system can include a cut-out section, and the cooling system can further comprise a primary top block plate connected with the primary top base plate at the cut-out section, and a primary bottom block plate connected with the primary bottom base plate at the cut-out section. Each of the primary top block plate and the primary bottom block plate can have a different thermal conductivity in relation to each of the primary top base plate and the primary bottom base plate.

In another embodiment, a cooling system comprises a primary heat sink comprising a primary top base plate, a primary bottom base plate and a primary fin pack comprising a plurality of fins, wherein the primary fin pack is disposed between the primary top base plate and the primary bottom base plate. The cooling system further comprises a first secondary heat sink comprising a first secondary top base plate, a first secondary bottom base plate and a first secondary fin pack comprising a plurality of fins, where the first secondary fin pack is disposed between the first secondary top base plate and the first secondary bottom base plate. In addition, the cooling system comprises a second secondary heat sink comprising a second secondary top base plate, a second secondary bottom base plate and a second secondary fin pack comprising a plurality of fins, where the second secondary fin pack is disposed between the second secondary top base plate and the second secondary bottom base plate. Further, the cooling system comprises a plurality of heat pipes, where the plurality of heat pipes comprises a first heat pipe that extends between the primary top base plate and the primary bottom base plate and further extends from the primary heat sink to couple with the first secondary heat sink, and a second heat pipe that extends between the primary top base plate and the primary bottom base plate and further extends from the primary heat sink to couple with the second secondary heat sink.

A top portion of each of the first heat pipe and the second heat pipe of the cooling system can extend between the primary top base plate and a top side of the primary fin pack, and a bottom portion of each of the first heat pipe and the second heat pipe of the cooling system can extend between the primary bottom base plate and a bottom side of the primary fin pack. The first heat pipe can extend from the primary top base plate to the primary bottom base plate and further from the primary bottom base plate to the first secondary bottom base plate, and the second heat pipe can extend from the primary top base plate to the primary bottom base plate and further from the primary bottom base plate to the second secondary bottom base plate.

The cooling system can further comprise a third heat pipe that extends from the primary bottom base plate to the primary top base plate and further from the primary top base plate to the first secondary top base plate, and a fourth heat pipe that extends from the primary bottom base plate to the primary top base plate and further from the primary top base plate to the second secondary top base plate.

A length dimension of the fins for each of the first secondary fin pack and the second secondary fin pack of the cooling system can be less than a length dimension of the fins for the primary fin pack, where each length dimension is defined in a direction of airflow through the primary fin pack, the first secondary fin pack and the second secondary fin pack.

Each of the primary top base plate and the primary bottom base plate of the cooling system can include a cut-out section, and the cooling system can further comprise a primary top block plate connected with the primary top base plate at the cut-out section, and a primary bottom block plate connected with the primary bottom base plate at the cut-out section. Each of the primary top block plate and the primary bottom block plate can have a different thermal conductivity in relation to each of the primary top base plate and the primary bottom base plate.

In a further embodiment, an apparatus comprises a printed circuit board (PCB), a heat generating component integrated with the PCB, and a cooling system. The cooling system comprises a primary heat sink disposed along the PCB and comprising a primary top base plate, a primary bottom base plate and a primary fin pack comprising a plurality of fins, where the primary fin pack is disposed between the primary top base plate and the primary bottom base plate, wherein the primary heat sink is disposed over the heat generating component. The cooling system further comprises a secondary heat sink disposed along the PCB comprising a secondary top base plate, a secondary bottom base plate and a secondary fin pack comprising a plurality of fins, wherein the secondary fin pack is disposed between the secondary top base plate and the secondary bottom base plate. In addition, the cooling system comprises a heat pipe that extends between the primary top base plate and the primary bottom base plate, where the heat pipe further extends from the primary heat sink and couples with the secondary heat sink.

The apparatus can further comprise one or more fans disposed along the PCB so as to direct a flow of air through each of the primary fin pack and the secondary fin pack.

The cooling system of the apparatus can further comprise a plurality of secondary heat sinks disposed along the PCB and coupled with the primary heat sink.

The cooling system of the apparatus can also further comprise a plurality of heat pipes extending between the primary top base plate and the primary bottom base plate, where the plurality of heat pipes comprises a first heat pipe extending from the primary top base plate to the primary bottom base plate and further from the primary bottom base plate to the secondary bottom base plate, and a second heat pipe extending from the primary bottom base plate to the primary top base plate and further from the primary top base plate to the secondary top base plate.

The heat generating component of the apparatus can comprise a processor.

In addition, the apparatus can comprise a server that houses the PCB and the cooling system.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cooling system comprising:
   a primary heat sink comprising a primary top base plate, a primary bottom base plate and a primary fin pack comprising a plurality of fins, wherein the primary fin pack is disposed between the primary top base plate and the primary bottom base plate;
   a secondary heat sink comprising a secondary top base plate, a secondary bottom base plate and a secondary fin pack comprising a plurality of fins, wherein the secondary fin pack is disposed between the secondary top base plate and the secondary bottom base plate; and
   a plurality of heat pipes extending between the primary top base plate and the primary bottom base plate so as to couple the primary heat sink with the secondary heat sink, the plurality of heat pipes comprising:
   a first heat pipe extending from the primary top base plate to the primary bottom base plate and further from the primary bottom base plate to the secondary bottom base plate; and
   a second heat pipe extending from the primary bottom base plate to the primary top base plate and further from the primary top base plate to the secondary top base plate.

2. The cooling system of claim 1, further comprising a plurality of secondary heat sinks coupled with the primary heat sink.

3. The cooling system of claim 1, wherein a length dimension of the fins for the secondary fin pack is less than a length dimension of the fins for the primary fin pack, and each length dimension is defined in a direction of airflow through the primary fin pack and the secondary fin pack.

4. An apparatus comprising:
   a printed circuit board (PCB);
   a heat generating component integrated with the PCB; and
   the cooling system of claim 1.

5. The apparatus of claim 4, further comprising:
   one or more fans disposed along the PCB so as to direct a flow of air through each of the primary fin pack and the secondary fin pack.

6. The apparatus of claim 4, wherein the cooling system further comprises a plurality of secondary heat sinks disposed along the PCB and coupled with the primary heat sink.

7. The apparatus of claim 4, wherein the heat generating component comprises a processor.

8. The apparatus of claim 4, wherein the apparatus comprises a server that houses the PCB and the cooling system.

9. A cooling system comprising:
   a primary heat sink comprising a primary top base plate, a primary bottom base plate and a primary fin pack comprising a plurality of fins, wherein the primary fin pack is disposed between the primary top base plate and the primary bottom base plate;
   a secondary heat sink comprising a secondary top base plate, a secondary bottom base plate and a secondary fin pack comprising a plurality of fins, wherein the secondary fin pack is disposed between the secondary top base plate and the secondary bottom base plate; and
   a heat pipe that extends between the primary top base plate and the primary bottom base plate, wherein the heat pipe further extends from the primary heat sink and couples with the secondary heat sink;
   wherein each of the primary top base plate and the primary bottom base plate includes a cut-out section, and the cooling system further comprises a primary top block plate connected with the primary top base plate at the cut-out section, and a primary bottom block plate connected with the primary bottom base plate at the cut-out section.

10. The cooling system of claim 9, wherein each of the primary top block plate and the primary bottom block plate has a different thermal conductivity in relation to each of the primary top base plate and the primary bottom base plate.

11. The cooling system of claim 9, wherein a top portion of the heat pipe extends between the primary top base plate and a top side of the primary fin pack, and a bottom portion of the heat pipe extends between the primary bottom base plate and a bottom side of the primary fin pack.

12. A cooling system comprising:
a primary heat sink comprising a primary top base plate, a primary bottom base plate and a primary fin pack comprising a plurality of fins, wherein the primary fin pack is disposed between the primary top base plate and the primary bottom base plate;
a first secondary heat sink comprising a first secondary top base plate, a first secondary bottom base plate and a first secondary fin pack comprising a plurality of fins, wherein the first secondary fin pack is disposed between the first secondary top base plate and the first secondary bottom base plate;
a second secondary heat sink comprising a second secondary top base plate, a second secondary bottom base plate and a second secondary fin pack comprising a plurality of fins, wherein the second secondary fin pack is disposed between the second secondary top base plate and the second secondary bottom base plate; and
a plurality of heat pipes, the plurality of heat pipes comprising:
 a first heat pipe that extends between the primary top base plate and the primary bottom base plate and further extends from the primary heat sink to couple with the first secondary heat sink; and
 a second heat pipe that extends between the primary top base plate and the primary bottom base plate and further extends from the primary heat sink to couple with the second secondary heat sink;
wherein:
 a top portion of each of the first heat pipe and the second heat pipe extends between the primary top base plate and a top side of the primary fin pack, and a bottom portion of each of the first heat pipe and the second heat pipe extends between the primary bottom base plate and a bottom side of the primary fin pack;

the first heat pipe extends from the primary top base plate to the primary bottom base plate and further from the primary bottom base plate to the first secondary bottom base plate; and
the second heat pipe extends from the primary top base plate to the primary bottom base plate and further from the primary bottom base plate to the second secondary bottom base plate.

13. The cooling system of claim 12, further comprising:
a third heat pipe that extends from the primary bottom base plate to the primary top base plate and further from the primary top base plate to the first secondary top base plate; and
a fourth heat pipe that extends from the primary bottom base plate to the primary top base plate and further from the primary top base plate to the second secondary top base plate.

14. The cooling system of claim 12, wherein a length dimension of the fins for each of the first secondary fin pack and the second secondary fin pack is less than a length dimension of the fins for the primary fin pack, and each length dimension is defined in a direction of airflow through the primary fin pack, the first secondary fin pack and the second secondary fin pack.

15. The cooling system of claim 12, wherein each of the primary top base plate and the primary bottom base plate includes a cut-out section, and the cooling system further comprises a primary top block plate connected with the primary top base plate at the cut-out section, and a primary bottom block plate connected with the primary bottom base plate at the cut-out section.

16. The cooling system of claim 15, wherein each of the primary top block plate and the primary bottom block plate has a different thermal conductivity in relation to each of the primary top base plate and the primary bottom base plate.

* * * * *